US007948077B2

(12) United States Patent
Andry et al.

(10) Patent No.: US 7,948,077 B2
(45) Date of Patent: May 24, 2011

(54) INTEGRATED CIRCUIT CHIP MODULE WITH MICROCHANNEL COOLING DEVICE HAVING SPECIFIC FLUID CHANNEL ARRANGEMENT

(75) Inventors: Paul S. Andry, Yorktown Heights, NY (US); Evan G. Colgan, Chestnut Ridge, NY (US); Lawrence S. Mok, Brewster, NY (US); Chirag S. Patel, Peekskill, NY (US); David E. Seeger, Congers, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 12/134,883

(22) Filed: Jun. 6, 2008

(65) Prior Publication Data
US 2008/0315403 A1    Dec. 25, 2008

Related U.S. Application Data

(60) Continuation of application No. 11/735,155, filed on Apr. 13, 2007, now Pat. No. 7,888,786, and a continuation of application No. 11/393,324, filed on Mar. 30, 2006, which is a division of application No. 10/987,985, filed on Nov. 12, 2004, now Pat. No. 7,230,334.

(51) Int. Cl.
*H01L 23/473* (2006.01)
*H01L 23/52* (2006.01)

(52) U.S. Cl. .................. 257/713; 257/E23.098
(58) Field of Classification Search .......... 257/712, 257/713, 714, 715, 716, E23.08, E23.097, 257/E23.098, E23.102, E23.103, E23.104, E23.105; 438/122
See application file for complete search history.

(56) References Cited

U.S. PATENT DOCUMENTS

| | | | |
|---|---|---|---|
| 4,266,282 A | 5/1981 | Henle et al. | |
| 5,016,090 A | 5/1991 | Galyon et al. | |
| 5,031,071 A | 7/1991 | Seibert et al. | |
| 5,031,072 A | 7/1991 | Malhi et al. | |
| 5,199,165 A | 4/1993 | Crawford et al. | |
| 5,218,515 A | 6/1993 | Bernhardt | |
| 5,258,648 A | 11/1993 | Lin | |
| 5,269,372 A | 12/1993 | Chu et al. | |
| 5,309,318 A | 5/1994 | Beilstein, Jr. et al. | |
| 5,430,614 A | 7/1995 | Difrancesco | |
| 5,453,641 A * | 9/1995 | Mundinger et al. | 257/714 |
| 5,587,882 A * | 12/1996 | Patel | 361/705 |

(Continued)

FOREIGN PATENT DOCUMENTS
JP    10-012814    1/1998

*Primary Examiner* — Lynne A Gurley
*Assistant Examiner* — Andrew O. Arena
(74) *Attorney, Agent, or Firm* — F. Chau & Associates, LLC

(57) ABSTRACT

Apparatus and methods are provided for integrating microchannel cooling modules within high-density electronic modules (e.g., chip packages, system-on-a-package modules, etc.,) comprising multiple high-performance IC chips. Electronic modules are designed such that high-performance (high power) IC chips are disposed in close proximity to the integrated cooling module (or cooling plate) for effective heat extraction. Moreover, electronic modules which comprise large surface area silicon carriers with multiple chips face mounted thereon are designed such that integrated silicon cooling modules are rigidly bonded to the back surfaces of such chips to increase the structural integrity of the silicon carriers.

19 Claims, 7 Drawing Sheets

U.S. PATENT DOCUMENTS

| | | |
|---|---|---|
| 5,812,375 A | 9/1998 | Casperson |
| 5,825,087 A | 10/1998 | Iruvanti et al. |
| 6,253,835 B1 * | 7/2001 | Chu et al. .................. 165/80.4 |
| 6,301,109 B1 * | 10/2001 | Chu et al. .................. 361/690 |
| 6,326,696 B1 | 12/2001 | Horton et al. |
| 6,400,012 B1 * | 6/2002 | Miller et al. ................ 257/712 |
| 6,593,644 B2 | 7/2003 | Chiu et al. |
| 6,653,730 B2 | 11/2003 | Chrysler et al. |
| 6,819,001 B2 * | 11/2004 | Burdick et al. .............. 257/778 |
| 6,988,534 B2 * | 1/2006 | Kenny et al. ................. 165/80.4 |
| 6,992,382 B2 | 1/2006 | Chrysler et al. |
| 7,009,301 B2 | 3/2006 | Jeong |
| 7,203,064 B2 * | 4/2007 | Mongia et al. ............... 361/701 |
| 7,422,910 B2 * | 9/2008 | Fitzgerald et al. ............ 436/180 |
| 2004/0112571 A1 * | 6/2004 | Kenny et al. ................. 165/80.3 |
| 2004/0156173 A1 | 8/2004 | Jeong |
| 2005/0151244 A1 | 7/2005 | Chrysler et al. |
| 2005/0200001 A1 * | 9/2005 | Joshi et al. .................. 257/712 |

* cited by examiner

INTEGRATED CIRCUIT CHIP MODULE WITH MICROCHANNEL COOLING DEVICE HAVING SPECIFIC FLUID CHANNEL ARRANGEMENT

CROSS-REFERENCE TO RELATED APPLICATION

This is a Continuation Application claiming the benefit of U.S. patent application Ser. No. 11/393,324, filed on Mar. 30, 2006 and U.S. application Ser. No. 11/735,155, filed on Apr. 13, 2007 now U.S. Pat. No. 7,888,786, which in turn are each a divisional of U.S. patent application Ser. No. 10/987,985 filed on Nov. 12, 2004, now U.S. Pat. No. 7,230,334 the entire contents of which are each incorporated by reference herein in their entireties.

TECHNICAL FIELD OF THE INVENTION

The present invention relates generally to apparatus and methods for packaging semiconductor IC (integrated circuit) chips with integrated cooling modules. More specifically, the present invention relates to apparatus and methods for integrating microchannel cooling modules within high-density chip packages and system-on-a-package modules comprising multiple high-performance IC chips.

BACKGROUND

In the design and manufacture of semiconductor IC chip packages and modules (e.g., SCM (single chip modules), MCMs (multi-chip modules), etc.), it is imperative to implement mechanisms that can effectively remove heat generated by IC chips, such as microprocessors or other high-performance chips, to ensure continued reliable operation of the IC chips. Effective heat removal becomes increasingly problematic as chip geometries are scaled down and operating speeds are increased, which results in increased power density. Moreover, as chip packages or electronic modules become more compact with multiple IC chips densely packed together, the increased heat density generated by operation of the chips in such close proximity can adversely affect integrated circuit components and cause physical damage to the package structure due to differences in thermal expansion of the package components. Accordingly, there is a continuing need for improved devices and methods for effectively cooling high-density and/or high-performance IC chip packages and modules.

One method of dense packaging of high performance chips, known as "system on a package", uses a silicon carrier with electrical through vias as an additional intermediate package layer between the chips and a ceramic first level package to provide high density and high performance electrical interconnects, such as described in U.S. Pat. No. 6,593,644, entitled "System on a Package Fabricated on a Semiconductor or Dielectric Wafer with Wiring on One Face, Vias Extending Through the Wafer, and External Connections on the Opposing Face," which is commonly assigned and fully incorporated herein by reference. Packaging structures and method described in this patent provide a number of significant advantages, but one critical factor that should be considered for practical implementations of package structures with silicon carriers is the size and thickness of such silicon carriers. For a silicon carrier to be useful, the carrier should be larger in size than the size of the chip or chip array to be mounted on the carrier. For example, the largest practical size for a high performance chip is currently about 20 mm×20 mm. Therefore, to mount a 2×2 array of such chips, the silicon carrier would need to be over 40 mm×40 mm in size.

Another factor that is considered when using silicon carriers in package structures is the thickness of the silicon carrier. It is desirable to make the silicon carrier substrate as thin as possible due the difficulties associated with forming electrical through vias and filling the vias with a conductive material and minimizing the inductance of the electrical interconnects. For example, if a silicon carrier is 0.2 mm thick and 40 mm wide, the width/thickness ratio is 200:1. As reported in the literature, a practical silicon carrier thickness is primarily limited by the ultimate aspect ratio of the through vias. In general, aspect ratio values much higher than about 10:1 are considered to be difficult to manufacture and make highly reliable. By way of example, the consortium composed mainly of Japanese Electronics companies known as the Association of Super-Advanced Electronic Technologies (ASET) has worked intensively on silicon carrier through-via technology for the past five years (see Takahashi, K. et al., "Current Status of Research and Development of Three-dimensional Chip Stacking Technology", Jpn. J. Appl. Phys. Vol. 40, (2001) pp. 3032-3037), and such work has culminated in a reportedly robust process employing 10 um wide vias and a carrier thickness fixed at 50 um (see Takahashi, K. et al., "Process Integration of 3D Chip Stack with Vertical Interconnection", Proc. 54th Electron. Components and Technol. Conf. Las Vegas, Nev., June 2004, pp. 601-609).

Some of the practical difficulties which occur with a large area and thin silicon carrier include increased risk of fracturing the silicon carrier during processing, bonding or assembly, as well as providing an effective means for cooling the chips mounted on the silicon carrier. It is difficult to use a conventional cooling means such as a thermal paste layer and a heat sink attached to the back surface of the chips since the force used to hold the heat sink in place and the large force used during assembly to insure a thin and uniform thermal paste layer could crack the silicon carrier. Therefore, packaging structures and methods that provide increased stiffness of a silicon carrier while providing a high performance cooling solution are highly desirable.

SUMMARY OF THE INVENTION

Exemplary embodiments of the invention generally include apparatus and methods for packaging semiconductor IC chips with integrated cooling modules. More specifically, exemplary embodiments of the invention include apparatus and methods for integrating microchannel cooling modules within high-density electronic modules (e.g., chip packages, system-on-a-package modules, etc.,) comprising multiple high-performance IC chips.

In general, electronic modules according to exemplary embodiments of the invention are designed such that high-performance (high power) IC chips are disposed in close proximity to an integrated cooling module (or cooling plate) for effective heat extraction. More specifically, exemplary embodiments of the invention include electronic modules which comprises an integrated cooling module and high-performance IC chips bonded directly to the cooling module. For instance, in one exemplary embodiment of the invention, the non-active surface of an IC chip can be rigidly bonded to a microchannel cooler device using solder, silver filled epoxy, or similar filled polymer.

In other exemplary embodiments of the invention, electronic modules are designed having a cooling module disposed between carrier substrates having a plurality of IC chips mounted on the carrier substrates. In such exemplary embodiments, high-performance IC chips are mounted in surface regions of the carrier substrates that are aligned with the cooling module. In other exemplary embodiments of the invention, conductive vias can be formed through the cooling module (e.g., in thermal microfins of a microchannel cooler) to provide electrical signal paths across the cooling module between the carrier substrates and/or the IC chips mounted on the carrier substrates.

In another exemplary embodiment of the invention, an electronic module comprises a first level carrier substrate and an intermediate carrier substrate bonded to the first level carrier substrate, wherein the intermediate carrier substrate comprises a plurality of IC chips flip-chip bonded thereto. A cooling device, such as a microchannel cooler, is thermally bonded to the non-active surfaces of each IC chip mounted on the intermediate carrier substrate using rigid bonding material. The cooling device is formed of a material which is thermal expansion matched to the material from which the intermediate substrate carrier is formed to reduce mechanical stresses caused by differences in thermal expansion. The microchannel cooling device provides cooling for the chips and additionally increases the structural integrity of the electronic assembly by rigidly bonding the microchannel cooler to the back surfaces of IC chips mounted on the intermediate carrier. Moreover, microchannel cooler is light weight and the bonding material can be compatible with a C4 reflow, such that the microchannel cooler could be assembled to the intermediate carrier package with the IC chips before bonding the intermediate carrier package to the first level package.

Exemplary packaging methods and structures according to the invention may be used for building a compact computer system-on-a-package comprising multiple IC processor chips, IC memory chips, and communication chips and modules, which are densely packed together with an integrated cooling module. In such embodiments, the high-performance IC processor chips are disposed in proximity to the integrated cooling module for efficient heat extraction.

These and other exemplary embodiments, aspects, features, and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
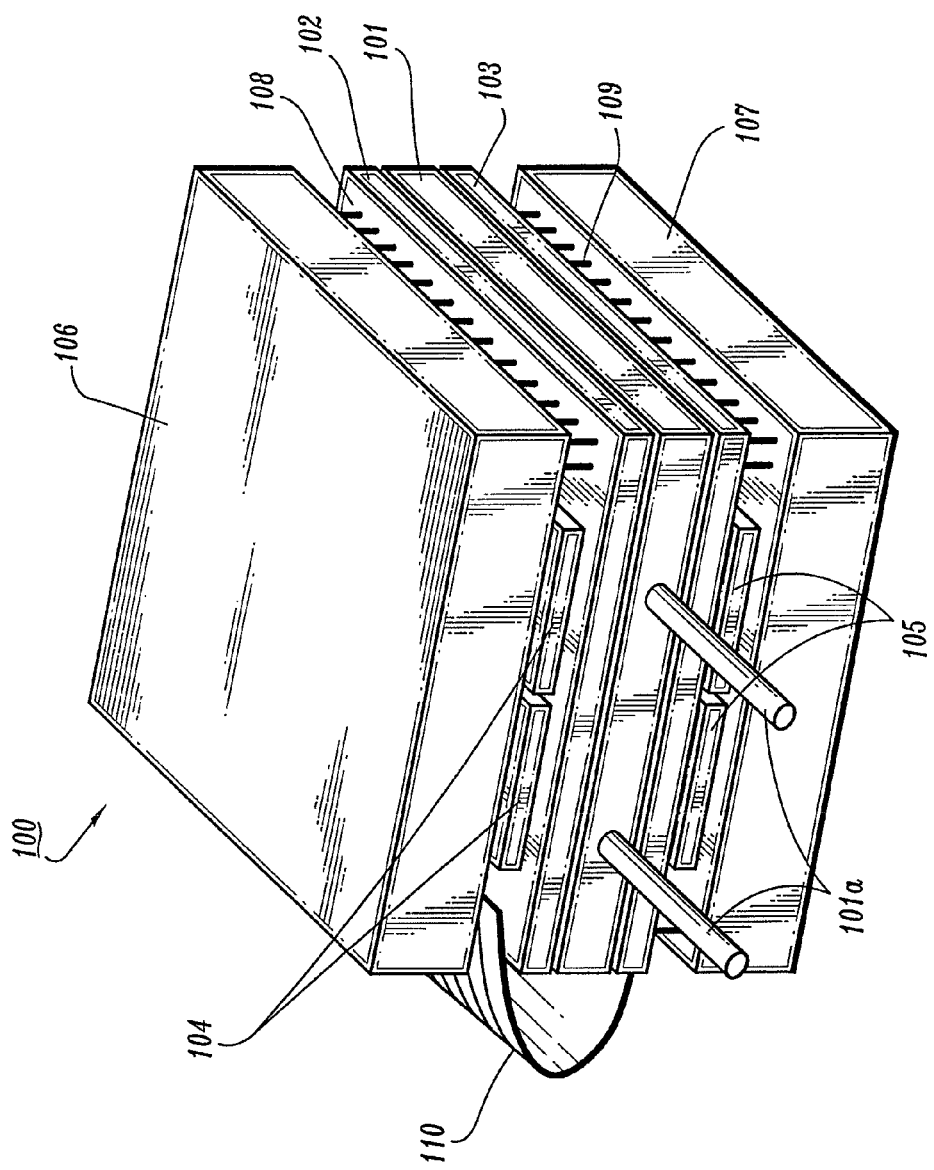
FIG. 1 is a schematic perspective view of an electronic module according to an exemplary embodiment of the invention.

FIG. 1 is a schematic perspective view of an electronic module according to an exemplary embodiment of the invention. FIG. 1 schematically illustrates an exemplary embodiment of an electronic module (100) comprising an integrated cooling module (101) (e.g., microchannel cooler) with high-performance IC chips (102) and (103) bonded directly to the cooling module (101). The cooling device (101) comprises a microchannel cooling device having a plurality of coolant inlet/outlets (101a) to enable coolant to flow in and out of the cooling device (101). In one exemplary embodiment, the electronic module (100) comprises a computer "system on a package" in a stacked chip structure, wherein the IC chips (102) and (103) are processor chips (e.g., CPUs, microprocessors, etc.). The back (non-active) surfaces of the IC processor chips (102) and (103) are thermally coupled to opposite surfaces of the cooling device (101). Furthermore, an array of IC memory chips (104) and (105) are flip-chip bonded to the active surface of the IC processor chips (102) and (103), respectively. It is to be understood that depending on the application, the module (100) can have any number and/or arrangement of IC memory chips bonded to the IC processor chips (102) and (103).

The electronic module (100) further comprises separate CIO (communication and input/output) modules (106) and (107) for corresponding IC processor chips (102) and (103), respectively. The CIO module (106) is connected to the IC processor chip (102) via an array of vertical pins, or solder columns, (108) mounted therebetween, and the CIO module (107) is connected to the IC processor chip (103) via an array of vertical pins, or solder columns, (109) mounted therebetween.

In one exemplary embodiment of the invention, each vertical pin or solder column may be formed of two separate solder bumps, wherein one solder bump originates on an IC processor chip and another solder bump originates on a corresponding CIO module, thus giving an effective "double bump" standoff height. Moreover, the IC memory chips may be thinned considerably, e.g., to 100 microns thick, using standard backside grind techniques, and the C4s used to join the IC memory chips to the corresponding IC processor chips may be reduced in height, making it possible to use more or less standard bumping techniques to assemble the module (100).

The CIO modules (106) and (107) can be bonded thermally to the non-active surfaces of the memory chips in IC memory chip arrays (104) and (105), respectively, if the CIO modules (106) and (107) need to dissipate heat through the memory chips and the IC processor chips. Alternatively, if the power of the CIO modules (106) and (107) are low, enabling heat to be easily dissipated to the surroundings, the CIO modules (106) and (107) do not have to be bonded to the respective memory chips of chip arrays (104) and (105) to the memory chips.

The CIO modules (106) and (107) are constructed to include the required electrical interconnects, bonding pads, integrated circuits/devices, I/O components, etc., that enable electrical connection/communication with other electronic components, devices, modules, power sources, etc. The IC processor chips (102) and (103) can directly communicate via a communication link provided by a flexible cable (110). Each end of the cable (110) is soldered to one of the IC processor chips (102) and (103) and disposed along the side of the module (100).

With the exemplary package structure of FIG. 1, the cooling device (101) is thermally coupled directly to IC processor chips (102) and (103) to provide increased cooling capacity for the module (100). Indeed, high-performance IC chips such as computer processors typically have high average power densities and may contain "hot spot" regions with increased (above-average) heat flux (power/unit area). Directly connecting the IC processor chips (102) and (103) to the cooling device (101) provides a low resistance heat conduction path and enables increased cooling. Further, the IC processor chips (102) and (103) are formed of a thermal conductive material (e.g., silicon) and act as thermal heat spreaders for extracting and conducting heat from the low-power density chips (104) and (105) to the cooling module (101).

In one exemplary embodiment, the non-active surfaces of the IC processor chips (102) and (103) are rigidly bonded to the cooling device (101) using a silver filled epoxy, filled polymer adhesive, filled thermoplastic or solder, or other thermally conductive bonding material with low thermal resistance. To reduce mechanical stresses, the material of the cooling device (101) is selected to have a TCE (thermal coefficient of expansion) that closely matches the TCE of the material of the IC processor chips (102) and (103). The ability to effectively use a rigid bond is limited not only by the difference in the TCEs of the materials that form the cooling device (101) and the IC chips, but also on the temperature range (cycle) in which the semiconductor package will operate or be exposed to, as well as size of the area over which the rigid bond will be formed.

Figure 3A:
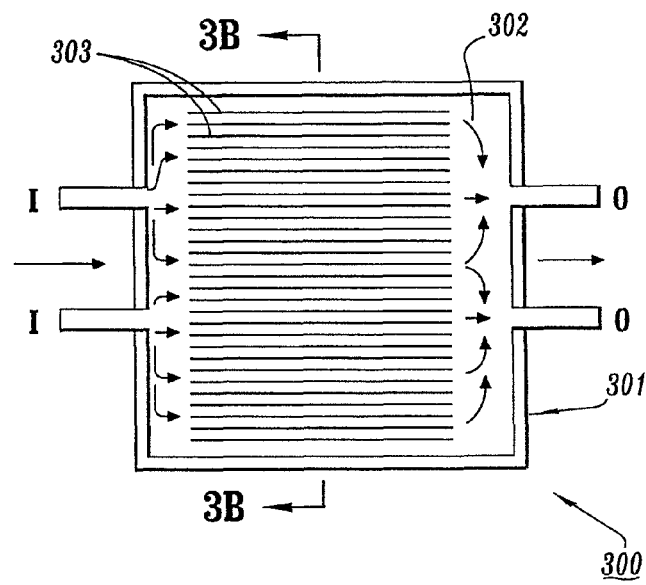
FIGS. 3A and 3B schematically illustrate a microchannel cooling device which can be integrated within an electronic module according to an exemplary embodiment of the invention.
Figure 3B:
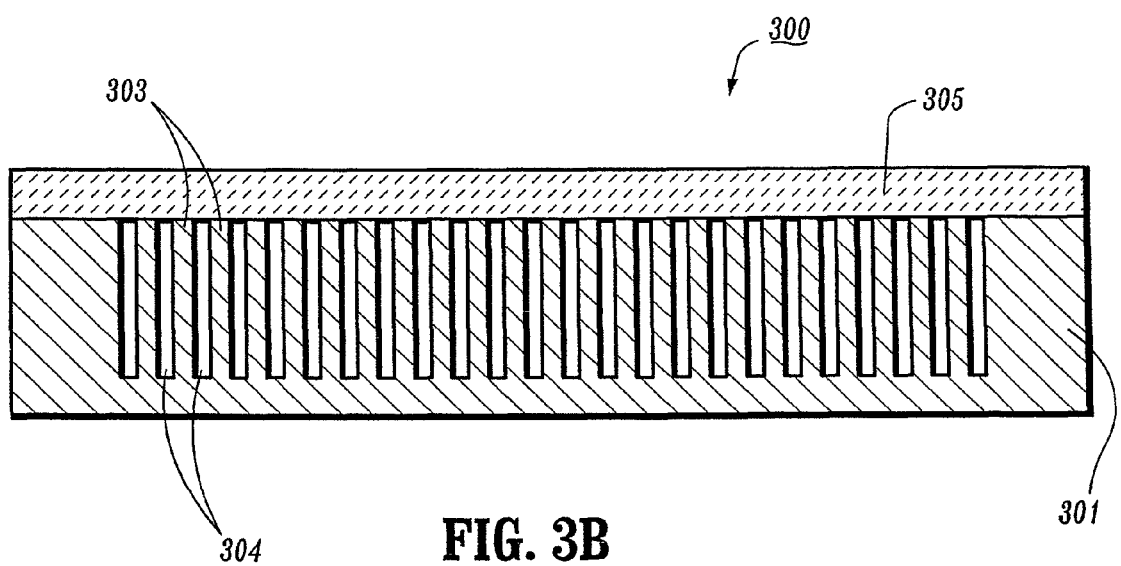

In one exemplary embodiment, the cooling device (101) comprises a microchannel cooling device having a plurality of coolant inlet/outlets (101a) to enable coolant to flow in and out of the cooling device (101). Microchannel cooling devices can be implemented for effectively cooling electronic devices under conditions of increased heat flux/high power densities (power/unit area), e.g., ~800 W/cm$^2$. FIGS. 3A and 3B are schematic diagrams that illustrate a microchannel cooling apparatus (300) which can be implemented for the cooling device (101) of FIG. 1. FIG. 3B illustrates a cross-sectional view of FIG. 3A along the line 3B-3B. As shown, the exemplary microchannel cooling device (300) comprises a planar substrate (301) (e.g., silicon substrate) that is etched to form a recessed region (302) comprising a plurality of parallel, microscopic heat conducting fins (303) which define a plurality of channels (304). A second substrate (305) (e.g., silicon substrate) (305), or cover plate, is bonded to the etched surface of the substrate (301) and the tops of the fins (303) thereby defining a chamber for the flow of a coolant (e.g., water) through the channels (304) between the inlets (I) and outlets (O). Heat removal is achieved by thermal contact between the fins (303) and the coolant fluid that flows through the channels (304).

It is to be understood that the cooling device (300) depicted in FIGS. 3A and 3B is merely one exemplary embodiment of the cooling device (101) of FIG. 1, and that any suitable microchannel cooling devices and methods known to those of ordinary skill in the art may be implemented and customer designed for the intended application. For instance, although the exemplary cooling module (300) is depicted as having two inlet/outlet ducts, it is to be understood that the number and orientation of the inlet/outlets of the cooling device will vary depending on the particular design. Moreover, the cooling device (300) may be formed to have two separate chambers to allow coolant flowing inside the two chambers in opposite directions.

Figure 2:
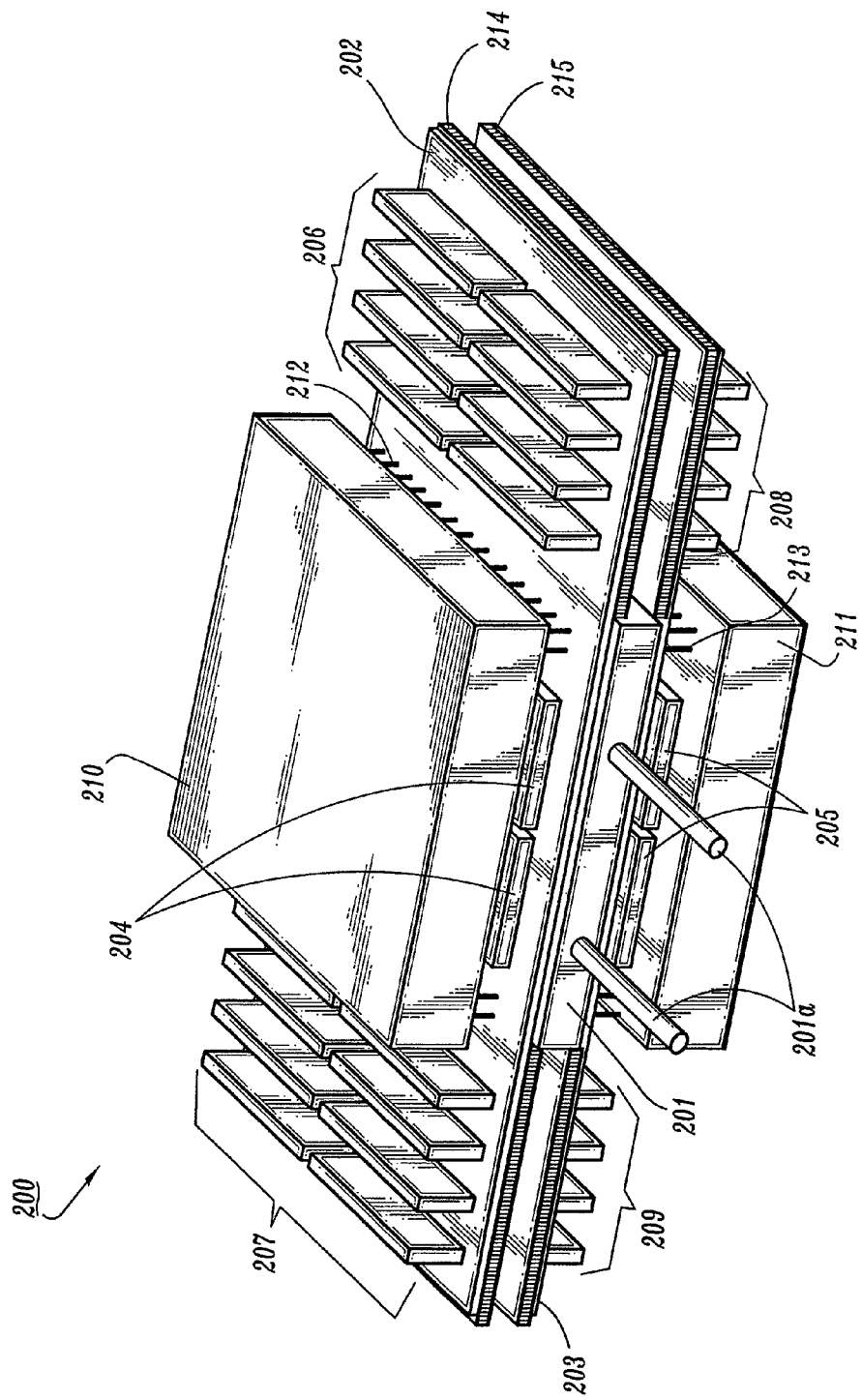
FIG. 2 is a schematic perspective view of an electronic module according to another exemplary embodiment of the invention.

FIG. 2 is a schematic perspective view of an electronic module according to another exemplary embodiment of the invention. FIG. 2 is one exemplary embodiment of an electronic module (200) which is designed having a cooling module disposed between carrier substrates having a plurality of IC chips mounted on the carrier substrates. In particular, FIG. 2 schematically depicts an electronic module (200) comprising a cooling device (201) interposed between a first carrier substrate (202) and a second carrier substrate (203) (e.g., silicon substrates). The cooling device (201) comprises a microchannel cooling device having a plurality of coolant inlet/outlets (201a) to enable coolant to flow in and out of the cooling device (201). An exemplary embodiment of the cooling device (201) will be discussed below with reference to FIG. 4, for example.

In one exemplary embodiment, the electronic module (200) comprises a computer "system on a package", wherein the first carrier substrate (202) comprises an array of IC processor chips (204) and arrays of IC memory chips (206) and (207) mounted on a surface thereof, and the second carrier substrate (203) comprises an array of IC processor chips (205) and arrays of IC memory chips (208) and (209) mounted on a surface thereof. The high-performance processor chip arrays (204) and (205) are mounted active area down in surface regions of respective carrier substrates (202) and (203) that are aligned with the cooling module (201). The carrier substrates (202) and (203) comprise one or more levels of metallization to provide the required conductive lines and interconnections for signal transmission between the IC memory chips and processor chips.

Moreover, in the exemplary embodiment of FIG. 2, the IC memory chip in the arrays (206)~(209) are vertically mounted on the respective carrier substrates (202) and (203) to provide a high density vertical chip package. In such embodiment, the IC memory chips can be designed such that the signal and power connections are formed on the edges of the IC memory chips that are bonded to the substrates. Methods for vertically mounting IC chips to carrier substrates are known to those of ordinary skill in the art. For instance, the methods described in U.S. Pat. No. 4,266,282, entitled "Vertical Semiconductor Integrated Circuit Chip Packaging", which is commonly assigned and fully incorporated herein by reference, may be implemented for forming carrier substrates (202) and (203) and vertically mounting the IC memory chips thereto.

The electronic module (200) further comprises separate CIO modules (210) and (211) for corresponding IC processor chip arrays (204) and (205), respectively. The CIO module (210) is connected to the carrier substrate (202) by soldering pins or solder columns (212) and the CIO module (211) is connected to the second carrier substrate (203) by soldering pins or solder columns (213). Alternatively, the CIO modules (210) and (211) can be connected to respective carrier substrates (202) and (203) using a pin and socket connection, as is well known to those of ordinary skill in the art. The CIO modules (210) and (211) are constructed to include the required electrical interconnects, bonding pads, integrated circuits/devices, I/O components, etc., that enable electrical connection/communication with other electronic components, devices, modules, power sources, etc.

In the exemplary embodiment of FIG. 2, the carrier substrates (202) and (203) provide a thermal path for conducting heat away from the IC processor chips and IC memory chips mounted thereon to the cooling device (201). In one exemplary embodiment of the invention, the carrier substrates (202) and (203) are formed having a thickness in a range of about 50 microns to about 400 microns. The cooling device (201) is disposed between the carrier substrates (202) and (203) in alignment with surface regions of carrier substrates on which the IC processor chip arrays (204) and (205) are mounted, where the heat density is the greatest. The high-density IC memory chip arrays (206)~(208) are disposed in regions of the respective carrier substrates adjacent the high-performance IC processor chip arrays, which extend past the cooling device (201). The IC memory chips can be effectively cooled by the heat spreading ability of the carrier substrates and the air columns formed between the IC memory chips. The portions of the carrier substrates (202) and (203) which extend past the cooling device (201) are supported by respective mechanical support structures (214) and (215).

In another exemplary embodiment, the cooling device (201) can be made the same size as the carrier substrates (202) and (203), in which case the mechanical support structures (214) and (215) would not be needed. With this exemplary embodiment, since the power dissipation rates are generally lower in the memory regions, the cooling channels in the cooling device (201) can be designed accordingly to handle higher power density in the processor region and relatively lower power density in the memory regions.

In one exemplary embodiment, the carrier substrates (202) and (203) are rigidly bonded to the cooling device (201) using a silver filled epoxy, filled polymer adhesive, filled thermoplastic or solder, or other thermally conductive bonding material with low thermal resistance. To reduce mechanical stresses in the thermal interface between the cooling module (201) and carrier substrates (202) and (203) due to thermal expansion/contraction, the material of the cooling device (201) is selected to have a TCE that closely matches the TCE of the material of the carrier substrates (202) and (203). Moreover, mechanical stresses in the thermal interface between the cooling device (201) and the carrier substrates (202) and (203) are reduced by limiting the size of the cooling device (201) to be aligned with only the high-performance IC processor chips. In particular, the cooling device (201) is made smaller than the carrier substrates (202) and (203) and thus, the surface area over which the rigid bond (or other thermal interface) between the cooling device and carrier substrates is limited (as compared to forming the cooling device (201) to have the same planar dimensions as the carrier substrates).

In another exemplary embodiment of the invention, the cooling device (201) is constructed to have a plurality of conducting through vias that provide connection paths between the first and second carrier substrates (202) and (203). In this exemplary embodiment, the surface regions of the carrier substrates (202) and (203) that are aligned with the cooling module (201) have bonding pads/connectors that can be bonded (via solder balls) to exposed portions of the conducting through vias (or other interconnects) on the respective mating surfaces of the cooling module (201) to provide electrical connections between IC chips on the different silicon carriers. Moreover, thermal conduction from the high performance processor chip arrays (204) and (205) to their respective silicon carriers (202) and (203) can be enhanced by filling the empty space among the solder ball bonds between the processor chips and silicon carriers as much as possible with additional solder balls (i.e. thermal via's) and by using a thermally conductive, and electrically insulating, underfill material. Additional structures to reduce the thermal conductivity in the silicon carriers and in the chip metallization levels can be formed, aligned with the additional solder balls, as is known to those of ordinary skill in the art.

It is to be appreciated that in one exemplary embodiment when the IC memory chips and carrier substrates (202) and (203) are made from silicon (or other TCE matched materials) the area density of the individual solder connections may be increased and/or the height of solder connections may be reduced to provide a further reduction in thermal resistance from the IC memory chip arrays (204) and (205) to the respective carrier substrates (202) and (203). Indeed, it is advantageous to keep the thermal resistance as small as possible to avoid a large delta T, which is the leading factor in chip-to-carrier stress (assuming matched TCEs). This approach is useful with high-density micro joins with pitches as low as "1 on 2" mil.

Figure 4:
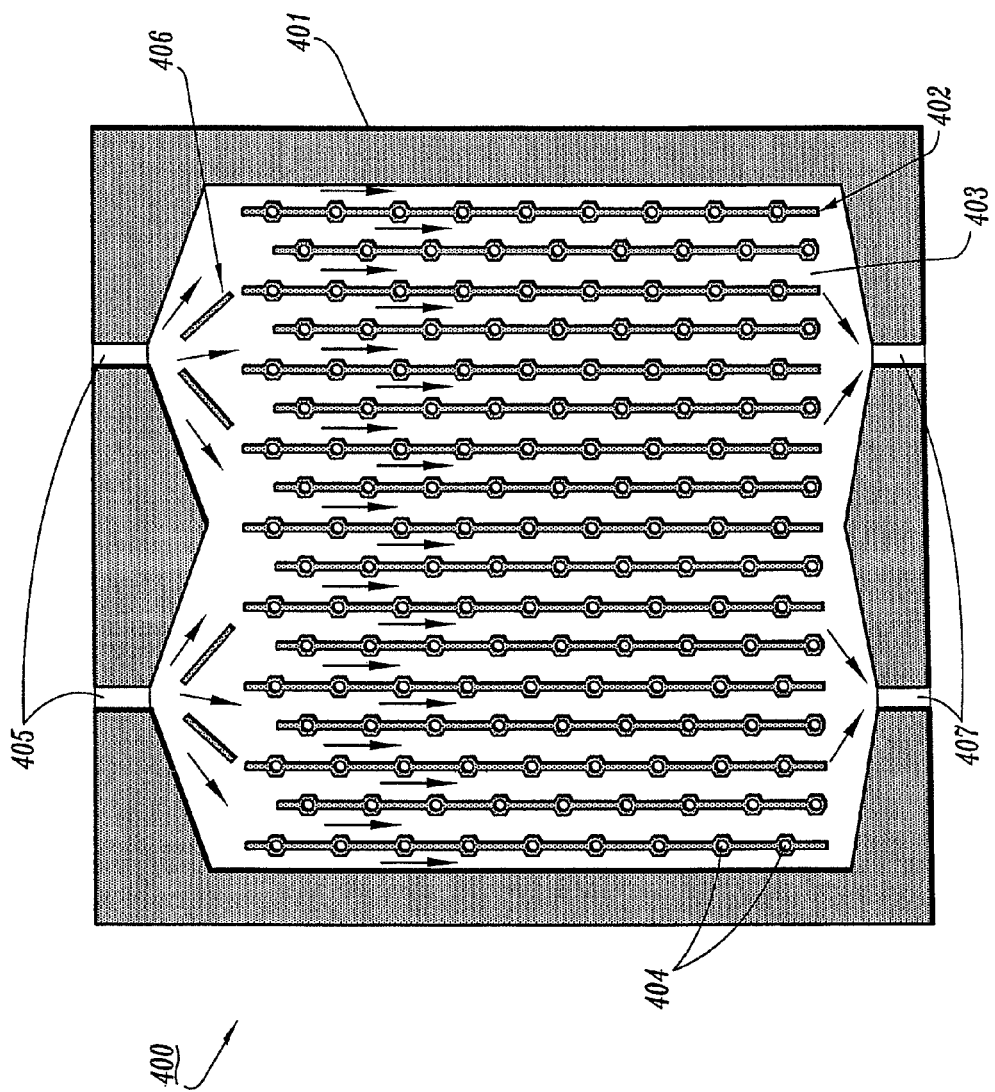
FIG. 4 schematically illustrates a microchannel cooling device which can be integrated within an electronic module according to another exemplary embodiment of the invention.

FIG. 4 schematically illustrates one exemplary embodiment of the cooling device (201) of FIG. 2, which has electrically conducting vias formed through the cooling module to provide electrical signal paths between silicon carriers (202) and (203). In particular, FIG. 4 depicts a microchannel cooling device (400) according to an exemplary embodiment of the invention, which comprises a substrate (401) (e.g., silicon substrate) that is etched to form a coolant chamber having microchannel pattern with multiple channel walls (402) and narrow channels (403) formed by the conventional silicon etching technology. A plurality of conductive through vias (404) are formed inside the channel walls (402). Coolant fluid flows into the microchannel cooling device (400) from inlet ducts (405) and the coolant fluid is diverted to the channels (403) by diverters (406). The coolant is then heated by absorbing heat from the channel walls (402) and then flows out of the microchannel cooler device (400) and exits through outlet ducts (407). The arrows denote the coolant flow direction. There are periodic widening portions along the channel walls (402) where the through vias (404) are located. Advantageously, the through vias (404) not only provide short communication paths for signal transmissions between the carrier substrates, but enable enhanced cooling of the module (200) due to the close proximity of the conductive through vias with the cooling fluid that flows through the microchannels (403).

Figure 5:
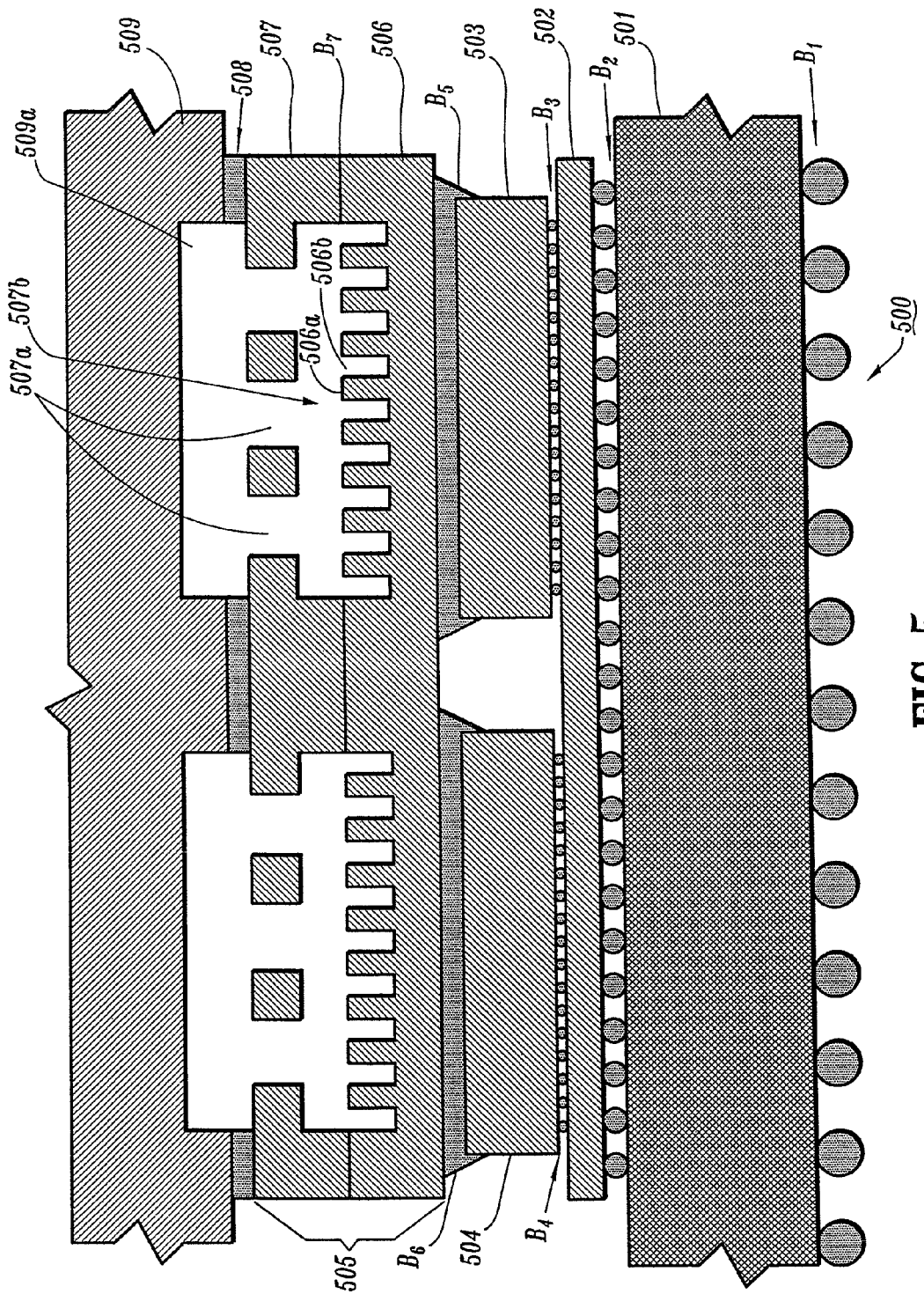
FIG. 5 schematically illustrates an electronic module according to another exemplary embodiment of the invention.

FIG. 5 is a schematic cross-sectional view of an electronic module according to another exemplary embodiment of the invention. More specifically, FIG. 5 schematically illustrates an electronic module (500) for integrating a microchannel cooler with IC chips mounted face down on a high-density wiring carrier such as a silicon carrier. In particular, the exemplary package comprises a first level package carrier (501) (e.g., ceramic substrate) with an array of large (~1 mm pitch) solder balls ($B_1$) (e.g., BGA, ball grid array) that are used for bonding the substrate (501) to a card or printed circuit board (not shown). The module (500) further comprises an intermediate (or $2^{nd}$ level) carrier substrate (502) (e.g., silicon substrate) having a plurality of IC chips (503) and (504) that are flip-chip bonded thereto. The intermediate carrier substrate (502) is bonded to the first level carrier substrate (501) via an array of fine pitch (~0.2 mm pitch) solder balls ($B_2$), such as C4's.

The carrier substrate (502) is constructed to comprise high density wiring on the top surface thereof for providing electrical interconnections to the IC chips (503) and (504) via high-density solder bump arrays ($B_3$) and ($B_4$) (~0.05 mm pitch), respectively. Moreover, the intermediate carrier substrate (502) comprises a plurality of conductive vias that are formed through the carrier substrate (502) to enable electrical connections with the first level package substrate (501) via the solder bump array ($B_2$). The intermediate carrier substrate (502) and ceramic substrate (501) are designed to provide a space transformation between electrical connections between the fine pitch solder ball arrays ($B_3$ and $B_4$) and the printed circuit board bond ball array ($B_1$) and to interconnect multiple chips on the intermediate carrier substrate (502).

The electronic module (500) further comprises an integrated microchannel cooling device (505) that is thermally bonded to the non-active surfaces of the IC chips (503) and (504) via respective rigid thermal bonds (B$_5$) and (B$_6$). The bonding material used for the rigid thermal bonds (B$_5$) and (B$_6$) may comprise any suitable material with low thermal resistivity, such as a solder, metal layer, Ag epoxy, or a filled polymer, to thereby allow sufficient heat conduction from the chips to the microchannel plate (506). A low thermal resistance bond such as a metal joint, solder joint, or a filled thermal adhesive such as a Ag epoxy, or other joining means could be used, as long as the bonding thickness is sufficiently thin and compatible with the cooling requirements. Further, it is desirable that the bonds (B$_5$) and (B$_6$) are reworkable, so that the microchannel cooler (505) can be removed from the chips, when necessary, to either replace the microchannel cooler device (505) or replace one or more of the chips (503) and (504).

In one exemplary embodiment, the microchannel cooler module (505) comprises a microchannel plate (506) connected to a manifold plate (507) via bond (B$_7$). The microchannel cooling device (505) extends over the IC chips and is approximately the same size, or slightly larger than, the intermediate carrier substrate (502). The microchannel and manifold plates (506) and (507) may be formed from silicon substrates, or other materials having TCE that matches the TCE of the material forming the IC chips (503) and (504). The microchannel plate (506) comprises a plurality of microfins (506a) that define channels (506b), which are formed in surface regions of the microchannel plate (506) that are aligned with the IC chips (503) and (504). Further, the manifold plate (507) (or manifold cover), which is bonded to the microchannel plate (506), comprises a plurality of fluid manifolds formed therein, wherein each fluid manifold comprises a corresponding manifold channel (507b) formed in one surface the manifold plate (507) and a corresponding pattern/series of fluid vias (507a) that form openings which extend from the opposing surface of the manifold plate (507) to various points along the corresponding manifold channel (507b).

Figure 5A:
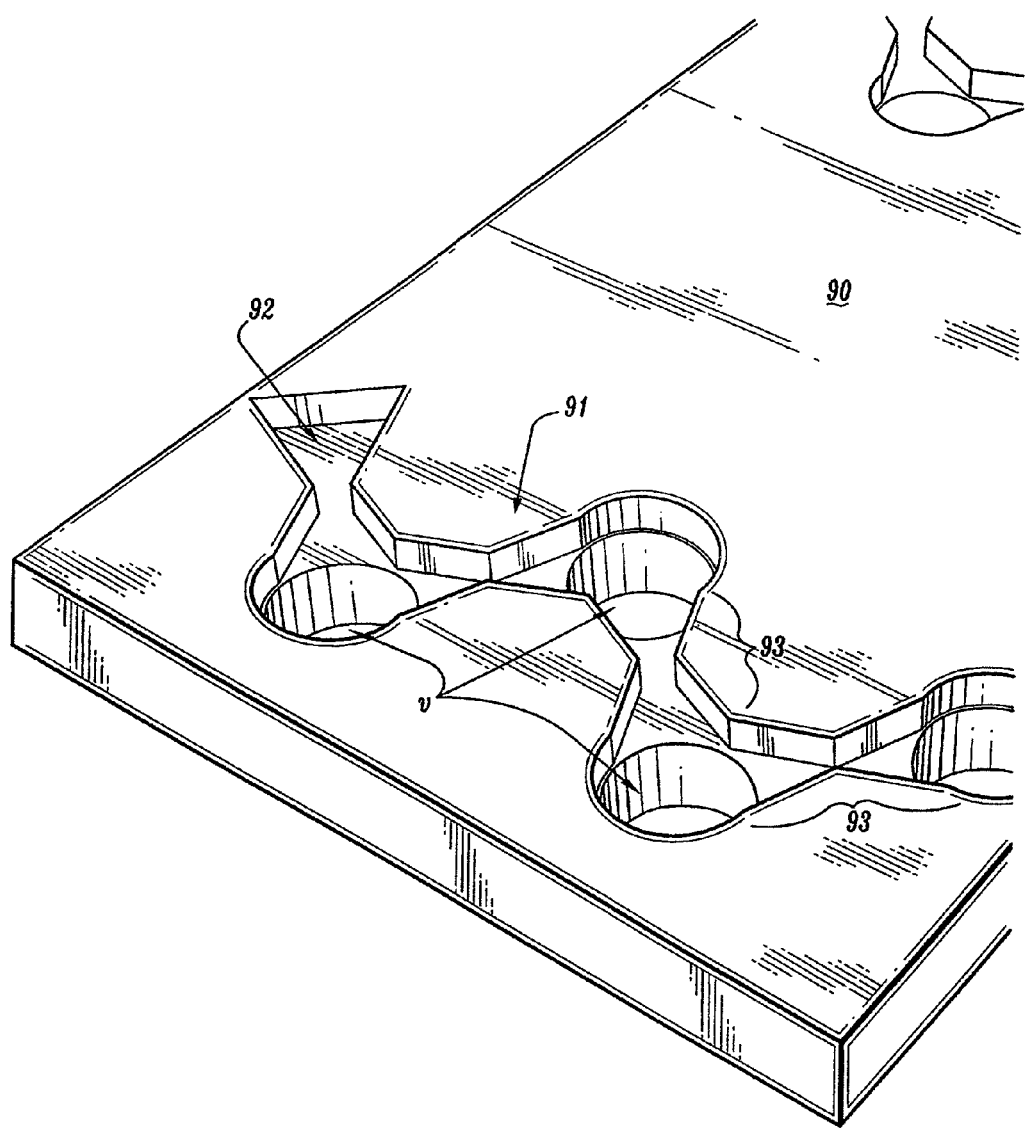
FIG. 5A is a three dimensional perspective view of a manifold plate that may be used in accordance with the integrated microchannel cooling device of FIG. 5.

The microchannel and manifold plates (506) and (507) may be formed using the methods described in U.S. patent application Ser. No. 10/883,392, filed Jul. 1, 2004, entitled "Apparatus and Methods for Microchannel Cooling of Semiconductor Integrated Circuit Packages", which is commonly assigned and fully incorporated herein by reference. In general, this application describes methods for constructing integrated microchannel cooler devices that include supply/return manifolds and microchannels/microfins which are structured, patterned, dimensioned and/or arranged in a manner that minimizes pressure drop and increases uniformity of fluid flow and distribution along coolant flow paths, as well as maintain the structural integrity of the manifold plate to prevent breakage during manufacturing. For instance, as explained in detail in U.S. Ser. No. 10/883,392 and also illustrated in FIG. 5A of the present application, manifold plate 90 having a fluid manifold (91) is designed such that fluid vias (v) for a given manifold channel 92 are formed as a series of circular openings, or openings with rounded corners, arranged in a zig-zag pattern, to reduce wafer cracking during manufacturing. The manifold channel 92 comprises tapered channel segments 93 formed between the circular openings/fluid vias (v) on the plate surface that faces the microchannels. The manifold is designed to reduce the potential of wafer breakage by using circular openings to minimize stress concentrations which can serve as crack nucleation sites, minimizing the total cavity area of the channel manifolds by using recessed regions of the microchannel pattern to act as a manifold in conjunction with the manifold channels, and avoid aligning the cavities along the (100) Si cleavage planes. In another exemplary embodiment of the invention, an integrated microchannel cooler device (505) may be formed from a single plate that is constructed with both microchannels and supply/return manifolds structures using the methods described in the above incorporated application.

The microchannel plate (506) and manifold plate (507) are bonded using bonding material (B$_7$) that is sufficient to provide a watertight seal, but the bond (B$_7$) does not have to provide a low thermal resistance. Accordingly, bonding methods such as direct wafer bonding, fusion bonding, anodic bonding, glass frit bonding, solder bonding, polymer adhesive bonding, or any other suitable bonding method may be used to join the microchannel and manifold plates (506) and (507).

The electronic module (500) further comprises a gasket (508) and package cap (509). The package cap (509) comprises fluid inlet/outlet manifolds (509a) that are aligned to corresponding inlets/outlets (507a) of the microchannel cooler device (505). The package cap (509) is connected to the back surface of the microchannel cooler (505) via the gasket (508). In one exemplary embodiment, the gasket (508) is adhered to both the microchannel cooler (505) and the package cap (509) using a high temperature epoxy or other suitable adhesive. In the exemplary embodiment of FIG. 5, the package cap (509) is designed as a fluid distribution manifold for delivering coolant fluid to/from integrated microchannel cooler device (505). The manifold structure of the package cap (509) can be designed using methods described in the above incorporated patent application U.S. Ser. No. 10/883,392.

For instance, the fluid distribution manifolds (509a) can be designed in a manner to minimize overall system pressure drop by using variable cross-sectional fluid supply/return channels for delivering coolant fluid to/from integrated microchannel cooler devices. Moreover, with the exemplary microchannel cooling device (505) depicted in FIG. 5, the fluid vias (507a) are formed on the back surface of the manifold plate (507) chip to input/output coolant fluid to/from the integrated microchannel cooler device, which enables the microchannel cooler device (505) to be dimensioned such that is does not extend significantly beyond the area of the array of chips to be cooled.

Figure 6:
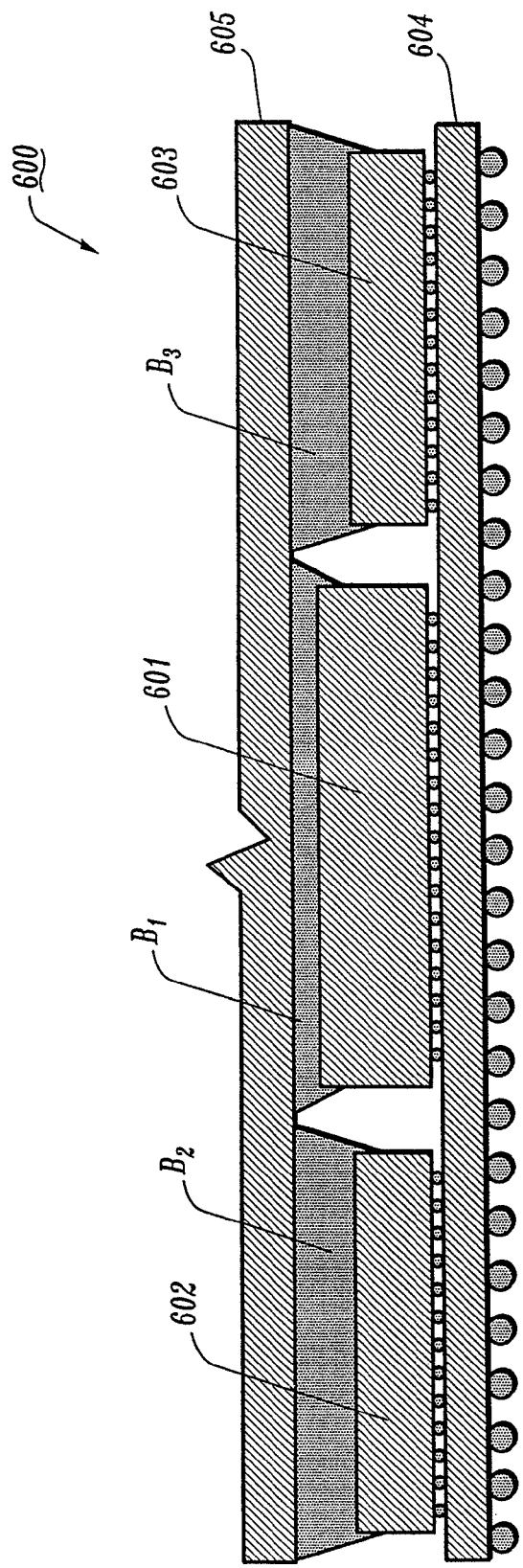
FIG. 6 schematically illustrates an electronic module according to another exemplary embodiment of the invention.

FIG. 6 is a schematic cross-sectional view of an electronic module (600) according to another exemplary embodiment of the invention. In particular, the electronic module (600) is an alternate embodiment similar to the electronic module (500) of FIG. 5, but wherein a high-performance processor chip (601) and memory chips (602) and (603), which have different thicknesses, are flip-chip mounted on an intermediate carrier substrate (604). In the exemplary embodiment of FIG. 6, the processor chip (601), which has a higher power density than the memory chips (602) and (603), is mounted in a center region of the intermediate carrier substrate (604), and the lower power density memory chips (or other chips), are mounted along the peripheral regions of the carrier (604). The chips (601), (602) and (603) are rigidly bonded a microchannel cooler device (605) via rigid thermal bonds B1, B2 and B3, respectively.

With the higher power-density chip (601), it is desirable to have a lower total thermal resistance in the thermal bond (b1) between the chip (601) and the microchannel cooler device (605) to maintain the same maximum junction temperature as compared to the lower power density chips (602) and (603). In particular, when assembling a microchannel cooler (605) over multiple chips (601~603) on a carrier (604) as depicted in the exemplary embodiment of FIG. 6, it is desirable to insure that the high power chip (601) have the thinnest bond layer of thermally conductive material to attach the chip (601) to the microchannel cooler (605). For example, in FIG. 6, if both memory chips (602) and (603) were thicker than the processor chip (601), the thickness of the bond line of the thermally conductive material ($B_1$) used to attach the processor chip (601) to the microchannel cooler (605) would be greater than that of the bonds $B_2$ and $B_3$. Thus, in the exemplary embodiment of FIG. 6, the lower power-density memory chips (602) and (603) are thinned slightly as compared to the high power processor chip (601) to insure that the thickness of the bond line is determined by the back surface of the processor chip (601). Methods for thinning of a lower power chip to accommodate different power densities while maintaining a simple hat or lid structure are described in U.S. patent application Ser. No. 10/711,023, filed on Aug. 18, 2004, entitled "Multiple Power Density Chip Structure", which is commonly assigned and fully incorporated herein by reference. The power density of the chips and also the desired junction temperature or power distribution of power on the chip are factors that are considered when determining the thermal resistance required to adequately cool the chips.

Various methods for assembling an electronic module having structures similar to those depicted in the exemplary embodiment of FIGS. 5 and 6 will now be described. An exemplary assembly process begins with mounting an array of chips to an intermediate silicon carrier using any suitable flip-chip bonding method known to those of ordinary skill in the art. Optionally, the mounted chips may be under filled and/or the back surface of the chips may be planarized by polishing, lapping, or grinding. Then, a previously assembled and pressure tested silicon microchannel cooler device can be attached to the back surface of the chips mounted on the carrier using a solder, metal layer, Ag epoxy, filled polymer, or other rigid thermally conductive bonding method. The silicon carrier, chips, and microchannel cooler package can then be assembled to a first level package using C4's. In a final step, a package cap with corresponding designed fluid inlet/outlet manifolds, is connected to the back surface of the microchannel cooler using a gasket. The gasket maybe adhered to both the microchannel cooler and the cap using a high temperature epoxy or other suitable adhesive. In an alternate embodiment, the microchannel cooler can be attached to the chips and silicon carrier after they are assembled to the first level package using C4's.

As discussed above, the use of a silicon carrier has a number of significant advantages such as using finer pitch electrical connections to the chips to provide greater electrical signaling capacity and greater wiring capacity. However, silicon carriers are difficult to cool using conventional methods because of their limited thickness and large area. A typical silicon carrier is between about 50 microns and about 200 microns thick (and could be as thick as 500 microns), but the lateral size could be 4 or 5 cm along each edge.

The exemplary package structures of FIGS. 5 and 6 according to the invention, which integrate silicon carriers and microchannel coolers, afford a number of significant advantages including, for example, providing a low thermal resistance path to the integrated microchannel cooler and using the microchannel cooler as a means of providing additional mechanical strength to thin silicon carriers to prevent fracture during subsequent processing and operation.

Although exemplary embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An electronic module, comprising:
a first carrier substrate;
a second carrier substrate formed of silicon, which is bonded to the first carrier substrate;
a high performance processor chip and a plurality of memory chips which have different thicknesses from each other are flip-chip bonded to the second carrier substrate, wherein the high performance processor chip, having a higher power density than the memory chips, is mounted in a center region of the second carrier substrate, wherein the memory chips are mounted along peripheral regions of the second carrier substrate;
a microchannel cooling device formed of silicon, wherein the memory chips and the high performance chips are rigidly bonded to the microchannel cooling device via rigid thermal bonds and wherein the high density power chip has a lower total thermal resistance in the thermal bond between the high density power chip and the microchannel cooler device to maintain a same maximum junction temperature as compared to the memory chips, the microchannel cooling device comprising:
a microchannel plate and a manifold plate connected to each other via a bonding material, the microchannel plate comprising:
a plurality of microfins that define a plurality of microchannels which are formed in surface regions of the microchannel plate that are aligned with the high performance processor chip and the plurality of memory chips, the manifold plate comprising:
a plurality of fluid manifolds formed therein, wherein each fluid manifold comprises a corresponding manifold channel formed in a surface of the manifold plate and a corresponding pattern of fluid vias that form openings which extend from an opposing surface of the manifold plate to various points along the corresponding manifold channel, and wherein the fluid vias for a given manifold channel are formed as a series of openings arranged in a zig-zag pattern and wherein the manifold channel includes:
tapered channel segments formed between the openings on a surface of the manifold plate that faces the microchannels.

2. The electronic module of claim 1, wherein the high density power chip has a thinnest bond layer of thermally conductive material to attach the high density power chip to the microchannel cooler device in comparison to bond layers of conductive material used to connect each of the memory chips to the microchannel cooler device.

3. The electronic module of claim 1, further comprising:
a gasket; and
a package cap comprising:
fluid distribution manifolds that are aligned to the corresponding vias of the microchannel cooling device, the package cap is connected to the manifold plate of the microchannel cooling device via the gasket, and wherein the gasket is adhered to both the manifold plate of the microchannel cooling device and the package cap.

4. The electronic module of claim 1, further comprising a plurality of tapered segments formed in a surface of the manifold plate that faces the microchannels and directly between a respective one of a plurality of adjacent pairs of the series of openings, wherein each of the plurality of tapered channel segments include opposing sidewalls which slant inwardly toward each other at a region of a respective one of the manifold channels located between a respective adjacent pair of the series of openings.

5. An electronic module, comprising:
a first carrier substrate;
a second carrier substrate formed of silicon, which is bonded to the first carrier substrate;
a plurality of IC (integrated circuit) chips flip-chip bonded to the second carrier substrate;
a microchannel cooling device formed of silicon, the microchannel cooling device comprising:
a microchannel plate and a manifold plate connected to each other via a bonding material that is sufficient to provide a watertight seal, wherein a first surface of the microchannel plate is thermally bonded to a non-active surface of each of the plurality of IC chips,
the microchannel plate comprising:
a plurality of microfins that define a plurality of microchannels which are formed in surface regions of the microchannel plate that are aligned with the plurality of IC chips, the manifold plate comprising:
a plurality of fluid manifolds formed therein, wherein each fluid manifold comprises a corresponding manifold channel formed in a surface of the manifold plate and a corresponding pattern of fluid vias that form openings which extend from an opposing surface of the manifold plate to various points along the corresponding manifold channel, wherein the fluid vias for a given manifold channel are formed as a series of openings arranged in a zig-zag pattern
and wherein the manifold channel comprises:
tapered segments formed between the openings on a surface of the manifold plate that faces the microchannels;
a gasket; and
a package cap comprising:
fluid distribution manifolds that are aligned to the corresponding vias of the microchannel cooling device, the package cap is connected to the manifold plate of the microchannel cooling device via the gasket, and wherein the gasket is adhered to both the manifold plate of the microchannel cooling device and the package cap.

6. The electronic module of claim 5, wherein the microchannel plate and the manifold plate are each formed of material having a thermal coefficient of expansion (TCE) which closely matches a TCE of the plurality of IC chips.

7. The electronic module of claim 6, wherein the bonding material thermally and ridgedly bonds the microchannel cooling device to the plurality of the IC chips, and wherein the bonding material has a low theimal resistivity.

8. The electronic module of claim 5, wherein the microchannel cooling device is removable from the plurality of IC chips.

9. The electronic module of claim 8, wherein bonds formed by the bonding material between the microchannel cooling device and the plurality of IC chips are reworkable such that the microchannel cooling device is removable from the plurality of IC chips.

10. An electronic module, comprising:
a first carrier substrate;
a second carrier substrate formed of silicon, which is bonded to the first carrier substrate;
a plurality of IC (integrated circuit) chips flip-chip bonded to the second carrier substrate;
a microchannel cooling device formed of silicon, the microchannel cooling device comprising:
a microchannel plate and a manifold plate connected to each other via a bonding material that is sufficient to provide a watertight seal, wherein a first surface of the microchannel plate is thermally bonded to a non-active surface of each of the plurality of IC chips,
the microchannel plate comprising:
a plurality of microfins that define a plurality of microchannels which are formed in surface regions of the microchannel plate that are aligned with the plurality of IC chips, the manifold plate comprising:
a plurality of fluid manifolds formed therein, wherein each fluid manifold comprises a corresponding manifold channel formed in a surface of the manifold plate and a corresponding pattern of fluid vias that form openings which extend from an opposing surface of the manifold plate to various points along the corresponding manifold channel, wherein the fluid vias for a given manifold channel are formed as a series of openings arranged in a zig-zag pattern in the manifold plate
and wherein the manifold channel comprises:
a tapered segment formed in a surface of the manifold plate that faces the microchannels and directly between an adjacent pair of the series of openings formed in the manifold plate, and wherein the tapered channel segment includes opposing sidewalls which slant inwardly toward each other at a region of the manifold channel located between the adjacent pair of the series of openings;
a gasket; and
a package cap comprising:
fluid distribution manifolds that are aligned to the corresponding vias of the microchannel cooling device, the package cap is connected to the manifold plate of the microchannel cooling device via the gasket, and wherein the gasket is adhered to both the manifold plate of the microchannel cooling device and the package cap.

11. The electronic module of claim 10, wherein the opposing sidewalls of the tapered segment slant inwardly toward each other at a middle region of the manifold channel located between the adjacent pair of the series of openings.

12. The electronic module of claim 11, wherein a width between the opposing slanted sidewalls of the tapered segment decreases from an end of each of the adjacent pair of the openings toward the middle region of the manifold channel located between the adjacent pair of the series of openings.

13. The electronic module of claim 10, further comprising a plurality of tapered segments formed in a surface of the manifold plate that faces the microchannels and directly between a respective one of a plurality of adjacent pairs of the series of openings, wherein each of the plurality of tapered channel segments include opposing sidewalls which slant inwardly toward each other at a region of a respective one of the manifold channels located between a respective adjacent pair of the series of openings.

14. The electronic module of claim 10, wherein the microchannel cooling device extends over the IC chips and is approximately the same size as the second carrier substrate.

15. The electronic module of claim 10, wherein the microchannel cooling device extends over the IC chips and is slightly larger than the second carrier substrate.

16. The electronic module of claim 10, wherein the first surface of the microchannel plate is thermally bonded to the non-active surface of each of the plurality of IC chips by one of the following materials selected from the group consisting of a solder, a metal layer a silver epoxy or a filled polymer.

17. The electronic module of claim 10, wherein the microchannel plate and the manifold plate are each formed of material having a thermal coefficient of expansion (TCE) which closely matches a TCE of the plurality of IC chips.

18. The electronic module of claim 10, wherein the microchannel cooling device is removable from the plurality of IC chips.

19. The electronic module of claim 18, wherein bonds formed by the bonding material between the microchannel cooling device and the plurality of IC chips are reworkable such that the microchannel cooling device is removable from the plurality of IC chips.

* * * * *